(12) United States Patent
Kubota et al.

(10) Patent No.: US 7,582,553 B2
(45) Date of Patent: Sep. 1, 2009

(54) METHOD OF BONDING FLYING LEADS

(75) Inventors: Takashi Kubota, Kawasaki (JP); Kenji Kobae, Kawasaki (JP); Kimio Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 34 days.

(21) Appl. No.: 11/359,426

(22) Filed: Feb. 23, 2006

(65) Prior Publication Data
US 2007/0141825 A1 Jun. 21, 2007

(30) Foreign Application Priority Data
Dec. 20, 2005 (JP) .............................. 2005-366338

(51) Int. Cl.
*H01L 21/44* (2006.01)
(52) U.S. Cl. .................. 438/617; 438/120; 438/121; 438/612; 438/613; 257/784; 257/E21.499; 257/E21.506
(58) Field of Classification Search ......... 438/106–127, 438/612, 613, 617; 257/E21.499, E21.506, 257/784
See application file for complete search history.

(56) References Cited

U.S. PATENT DOCUMENTS 5,184,400 A * 2/1993 Cray et al. ..................... 29/879
6,461,890 B1 10/2002 Shibata
6,555,764 B1 * 4/2003 Maruyama et al. ........... 174/267
2004/0217488 A1 * 11/2004 Luechinger ................. 257/784
2005/0026326 A1 * 2/2005 Kiritani et al. .............. 438/108
2005/0110161 A1 5/2005 Naito et al.

FOREIGN PATENT DOCUMENTS

| JP | 3-41744 | 2/1991 |
| JP | 5-63038 | 3/1993 |
| JP | 8-146451 | 6/1996 |
| JP | 10-150137 | 6/1998 |
| JP | 2002-83839 | 3/2002 |
| JP | 2004-146731 | 5/2004 |
| JP | 2005-93581 | 4/2005 |

* cited by examiner

*Primary Examiner*—Matthew Smith
*Assistant Examiner*—John M Parker
(74) *Attorney, Agent, or Firm*—Kratz, Quintos & Hanson, LLP

(57) ABSTRACT

The method of bonding flying leads is capable of efficiently supersonic-bonding the flying leads to pads of a board and improving bonding reliability therebetween. The method comprises the steps of: mechanically processing the board so as to form projections, which act as margins for deformation, in boding faces of the pads, on each of which the flying lead will be bonded, positioning the flying leads to correspond to the pads; and applying supersonic vibrations to a bonding tool so as to deform and crush the projections, whereby the flying leads are respectively bonded to the pads.

9 Claims, 5 Drawing Sheets

METHOD OF BONDING FLYING LEADS

BACKGROUND OF THE INVENTION

The present invention relates to a method of bonding flying leads, more precisely relates to a method of bonding flying leads to pads of a board by using supersonic vibrations.

A carriage assembly of a magnetic disk drive unit is shown in FIG. 8. The carriage assembly includes a plurality of carriage arms 10, whose number corresponds to that of magnetic disks, and suspensions 12, on which magnetic heads are mounted, are attached to front ends of the carriage arms 10. Base ends of the carriage arms 10 are attached to an actuator shaft 14, and the carriage arms 10 are turned about the shaft 14 and moved parallel to surfaces of the magnetic disks.

The magnetic heads mounted on the suspensions 12 are electrically connected to a signal transmission circuit by several manners. FIG. 8 shows a connecting structure using a so-called long tail suspension board, wherein an end of a suspension board of the suspension 12 is extended to a location of attaching a flexible board 16, which is attached to side faces of the base ends of the carriage arms 10, and ends of the suspension board is formed into flying leads.

In the connecting structure using the long tail suspension board, pads of the flexible board 16 and the flying leads 18 (see FIG. 9) of the long suspension board are correctly positioned, then the flying leads 18 are bonded to the pads by a supersonic bonding tool. In FIG. 9, the flying leads 18 are supersonic-bonded to the pads 17 of the flexible board 16 by the bonding tool 20.

The supersonic bonding method has been used for bonding a semiconductor chip to a circuit board by flip-chip connection, bonding wires to leads, etc. To securely perform the supersonic bonding, several ideas have been proposed. For example, Japanese Patent Gazette No. 10-150137 discloses a method of bonding wires, wherein a leadframe is pressed by a vibration restraining member so as to prevent resonance of the leadframe; Japanese Patent Gazette No. 2005-136399 discloses a method of forming bonding-electrodes, wherein an electrically conductive material is applied to electrodes of a circuit board so as to broaden a bonding area; Japanese Patent Gazettes No. 08-146451 and No. 10-189657 disclose methods of bonding two members, wherein an anisotropic conductive film is provided between the members, and supersonic waves are applied in the direction for mutual contact; Japanese Patent Gazette No. 05-63038 discloses a method of bonding two members, wherein their bonding faces are made rough; and Japanese Patent Gazette No. 2005-93581 discloses a method of bonding two members, wherein non-conductive adhesive is applied to bonding faces.

In the connecting structure using the long tail suspension board shown in FIG. 8, a plurality of the flying leads 18 are arranged parallel with minute separations. The flying leads 18 may be supersonic-bonded, one by one, to the pads 17, but it is efficient to simultaneously supersonic-bond a plurality of the flying leads 18 as shown in FIG. 9.

In FIG. 9, the bonding tool 20 contacts and bonds two flying leads 18. However, in case that the bonding tool 20 contacts a plurality of the flying leads 18, a working face of the bonding tool 20 is a flat face. So, if asperities exist in the bonding face, bonding strength differs at every bonding point, so that bonding reliability must be lowered.

FIG. 10 is a sectional view of the flying lead 18 and the pad 17, which have been mutually bonded. The boundary includes three kinds of parts: (1) completely bonded parts, wherein projections are crushed and oxide film is broken, so that the bonding faces are actually bonded each other; (2) poorly bonded parts, wherein the oxide film exists between the bonding faces; and (3) nonbonded parts "A", wherein the bonding faces are not bonded each other.

Outer surfaces of the flying leads 18 and the pads 17 are gold-plated, so that they are connected by gold-gold bonding. The gold plated layers are capable of absorbing the asperities formed in the bonding faces of the flying leads 18 and the pads 17. However, thickness of the gold layers are about 3 μm, so all of the asperities cannot be fully absorbed.

SUMMARY OF THE INVENTION

The present invention was conceived to solve the above described problems.

An object of the present invention is to provide a method of bonding flying leads, which is capable of efficiently supersonic-bonding the flying leads to pads of a board and improving bonding reliability therebetween.

To achieve the object, the method of bonding flying leads to pads of a board comprises the steps of: mechanically processing the board so as to form projections, which act as margins for deformation, in boding faces of the pads, on each of which the flying lead will be bonded; positioning the flying leads to correspond to the pads; and applying supersonic vibrations to a bonding tool so as to deform and crush the projections, whereby the flying leads are respectively bonded to the pads.

In the method, each of the projections may be formed by pressing a press tool onto the bonding face so as to form a cavity in the boding face, so that the projection is formed along an edge of the cavity. By pressing the press tool onto the bonding face, the projections can be easily formed in the bonding faces of the pads.

In the methods, each of the projections may be formed by pressing a press tool onto a reverse face of the board toward the pad, so that the projection is formed in the boding face.

In the method, the mechanical processing step may be performed by: driving a wedge section formed at a front end of a press tool into each of the bonding faces so as to form the projection around the wedge section; and separating the wedge section from the press tool so as to leave the wedge section in the pad. In this case, the flying leads can be bonded to the projections of the pads, further a function of bonding the flying leads to the wedge sections can be used, so that bonding reliability between the flying leads and the pads can be improved.

In the method, the press tool may double as the bonding tool, the flying leads may be positioned to correspond to the pads after forming the cavities in the pads by the press tool, and supersonic vibrations may be applied to the press tool so as to bond the flying leads to the pads. In this case, forming the projections and bonding the flying leads to the pads can be continuously performed. The working efficiency of this improved method can be higher than that of the conventional assembling method.

By employing the method of the present invention, the projections act as margins for deformation, so the flying leads can be securely bonded to the pads of the board, and bonding strength can be higher. Since the projections are formed in the board by the mechanical processing, the projections can be formed in the assembling step so that the flying leads can be securely and efficiently bonded to the pads.

BRIEF DESCRIPTION OF THE DRAWINGS

Embodiments of the present invention will now be described by way of examples and with reference to the accompanying drawings, in which.

DETAILED DESCRIPTION OF THE EMBODIMENTS

Preferred embodiments of the present invention will now be described in detail with reference to the accompanying drawings.

In the following embodiments, flying leads 18, which are formed in a long tail suspension board, are bonded to a flexible board 16 when a carriage assembly is assembled.

In the method of the following embodiments, projections are formed in bonding faces of pads 17 of the flexible board 16 by mechanical process. When the flying leads 18 are bonded to the pads 17 by supersonic bonding, the projections are crushed so that the flying leads 18 can be bonded to the pads 17. At that time, the projections act as margins for deformation.

First Embodiment

A first embodiment of the present invention will be explained with reference to FIGS. 1, 2A and 2B.

Figure 1:
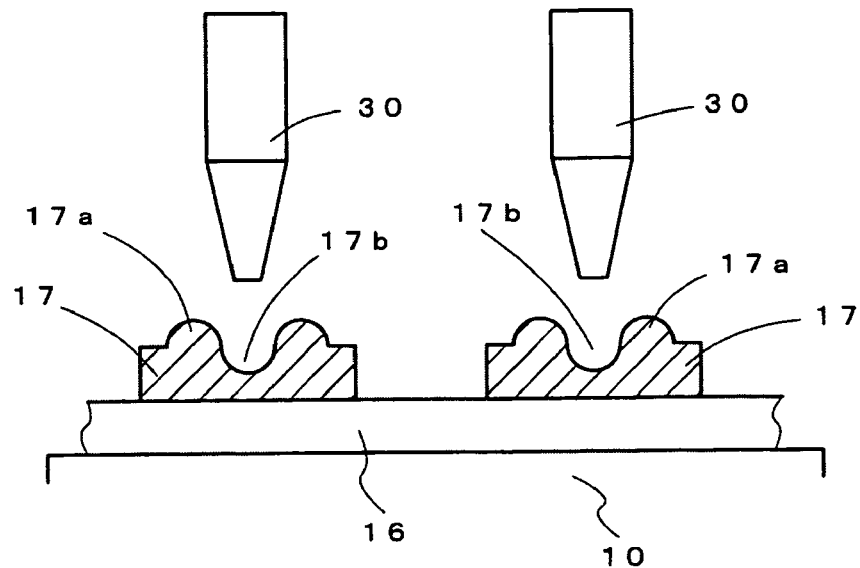
FIG. 1 is an explanation view showing a process of forming projections in pads by the method of a first embodiment.

FIG. 1 shows a process of forming the projections, which act as the margins for deformation when the supersonic bonding is performed, in the pads 17 of the flexible board 16. Press tools 30, whose lower ends are formed into circular cones having flat tips, are respectively pressed onto the pads 17 in the thickness direction, so that the projections 17a can be formed. By pressing the press tools 30 onto bonding faces, on which the flying leads 18 will be bonded, in the thickness direction, cavities 17b are respectively formed in the bonding faces of the pads 17. Thus, the projections 17a rise from edges of the cavities 17b.

Figure 2A:
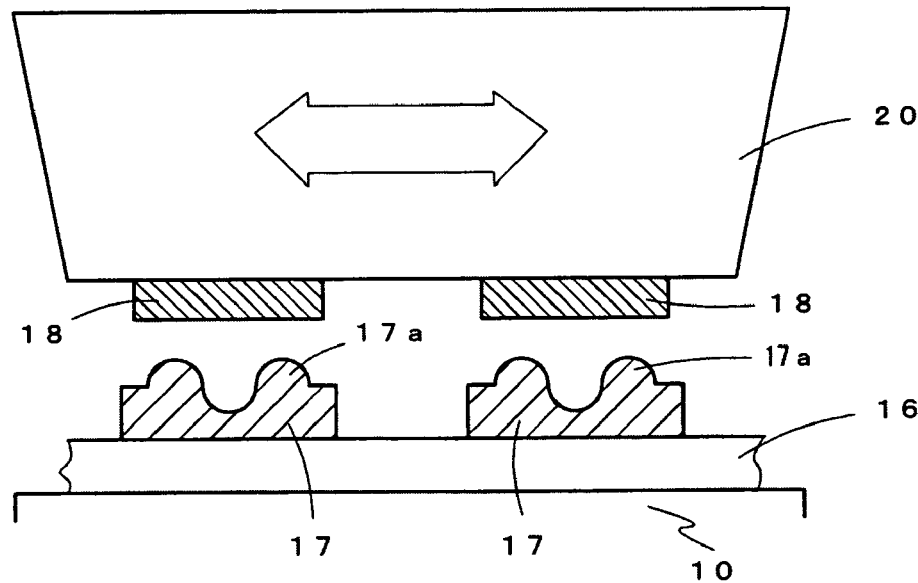
FIGS. 2A and 2B are explanation views showing a process of bonding flying leads to the pads formed by the method of the first embodiment.

FIG. 2A also shows that the flying leads 18 are flat-shaped. The flying leads in cross section comprise a rectangle having a width greater than a thickness thereof.

In FIG. 2A, the flying leads 18 are bonded to the pads 17 having the projections 17a by applying supersonic vibrations to a bonding tool 20. The flying leads 18, which are formed at an end of the long tail suspension board, are positioned above the pads 17 so as to respectively correspond to the pads 17, then the flying leads 18 are pressed into the pads 17 by the bonding tool 20 so that the flying leads 18 can be bonded to the pads 17. FIG. 2A shows that the bonding tool 20 has a width that is larger than an interval between the projections.

In the present embodiment, surfaces of the pads 17 and the flying leads 18 are plated with gold, so the pads 17 and the flying leads 18 are electrically connected by gold-gold bonding.

Figure 2B:
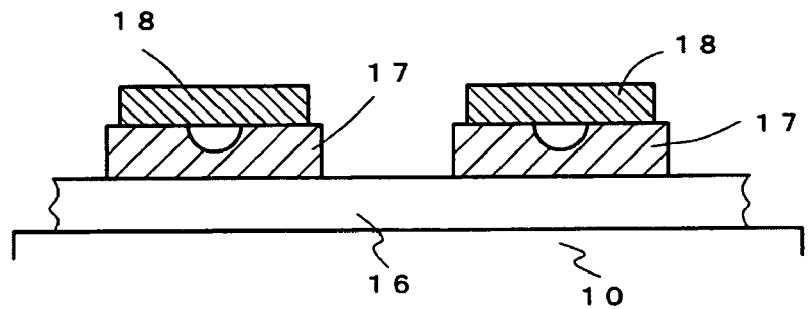

In FIG. 2B, the flying leads 18 are respectively bonded to the pads 17. When the bonding tool 20 applies supersonic vibrations to the flying leads 18 for bonding, the projections 17a formed in the boding faces of the pads 17 are crushed. Therefore, bonding strength between the flying leads 18 and the pads 17 is greater than that of the conventional method, in which the bonding faces of the pads are flat, so that the flying leads 18 can be securely bonded to the pads 17. When supersonic vibrations are applied, the projections 17a of the pads 17 are rubbed with the flying leads 18, so that the projections 17a are crushed and deformed. Therefore, the projections 17a act as the margins for deformation.

By forming the margins for deformation, which will be deformed by supersonic vibrations, the flying leads 18 can be securely bonded to the pads 17. Further, a plurality of the flying leads 18 are simultaneously bonded with the pads 17, so bonding efficiency can be improved and variation of the bonding strength can be prevented.

In the present embodiment, the projections 17a is formed by forming the cavities 17b in the pads 17. In comparison with another example, in which the projections are merely formed in the pads, contact areas between the flying leads 18 and the pads 17 can be broader so that the bonding strength therebetween can be greater.

Second Embodiment

A second embodiment of the present invention will be explained with reference to FIG. 3.

In the present embodiment, the press tool 30 is used for not only forming the projections 17a in the pads 17 but also supersonic-bonding the flying leads 18 to the pads as the bonding tool. The projections 17a are formed in the pads 17 by the press tool 30 as well as the first embodiment.

Figure 3:
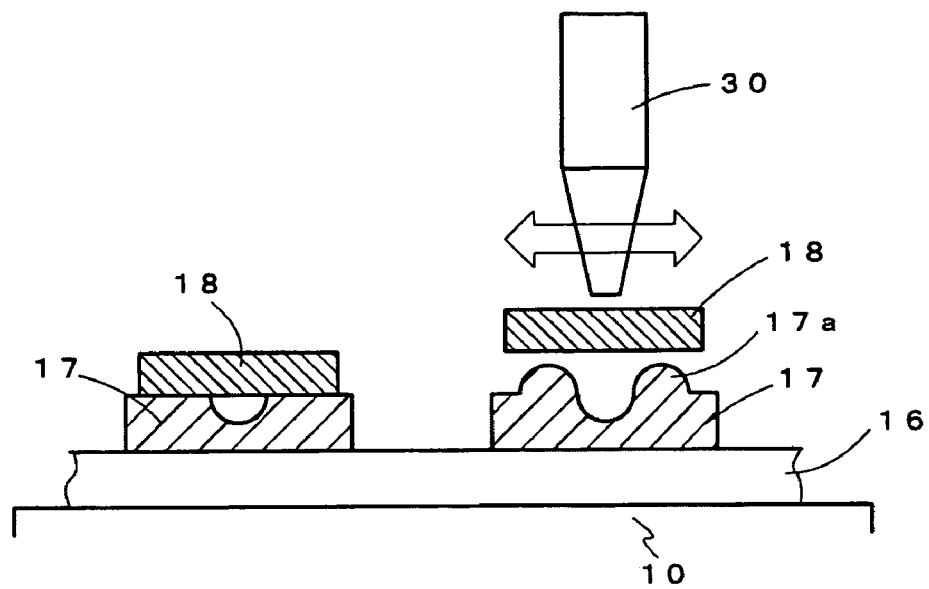
FIG. 3 is an explanation view showing a process of forming projections in pads by the method of a second embodiment.

In FIG. 3, the projections 17a are formed in the pads 17 by the press tool 30, then the flying leads 18 of the long tail suspension board are positioned to correspond to the pads 17. Further, supersonic vibrations are applied to the press tool 30, so that the flying lead 18 is pressed onto and bonded to the corresponding pad 17.

Since supersonic vibrations are applied to the press tool 30 to bond the flying leads 18 to the pads 17, the step of bonding the flying leads 18 to the pads 17 can be performed in succession to the step of forming the projections 17a in the pads 17. Therefore, working efficiency can be improved.

Note that, the process of forming the projections 17a, which act as margins for deformation, in the pads 17 is not limited to the above described embodiment. They may be formed by, for example, plating surfaces of the pads 17 when cable patterns are formed in the flexible board 16. However, in case that the projections are formed by plating when the cable patterns are formed in the flexible board 16, number of manufacturing steps must be increased, so that manufacturing cost must be increased. On the other hand, by using the press tool 30 for forming the projections 17a, the projections 17a can be formed in the assembling step, so that manufacturing cost can be reduced.

Third Embodiment

Figure 4:
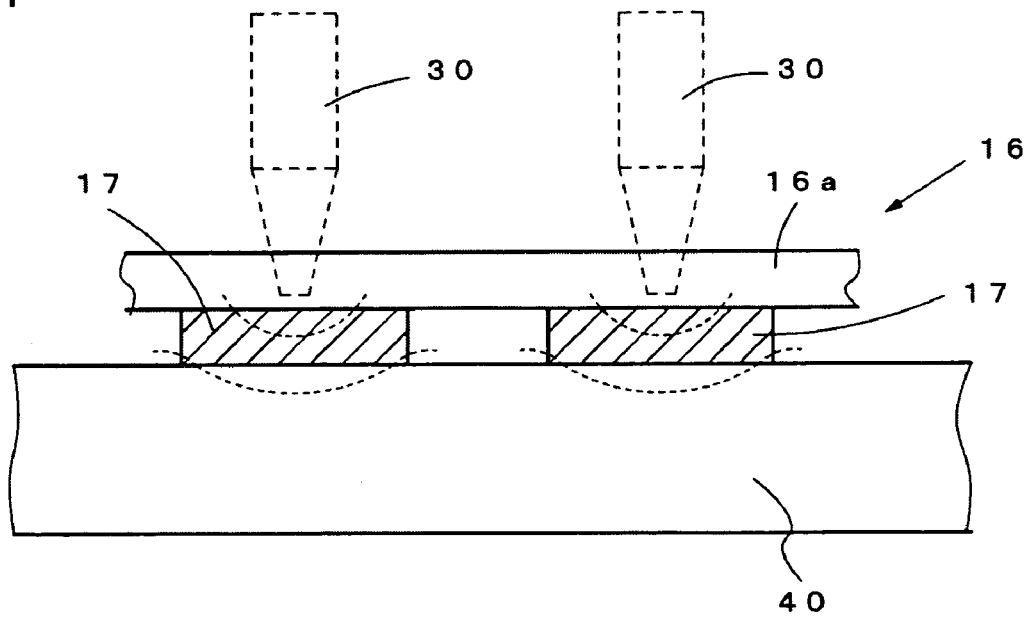
FIG. 4 is an explanation view showing a process of forming projections in pads by the method of a third embodiment.

A third embodiment of the present invention will be explained with reference to FIGS. 4, 5A and 5B.

In the present embodiment, the projections 17a are formed in the pads 17 by pressing the press tool 30 onto a reverse face of a plastic base member 16a of the board 16 toward the pads 17, so that the projections 17a can be formed in the boding faces of the pads 17. In FIG. 4, the board 16 mounted on a flexible supporting stage 40 with the pads 17 extending downward. The press tool 30 is pressed onto the reverse face of the base member 16a so as to form the projections 17a in the pads 17. The press tool 30 is positioned to correspond to the pad 17, then pressed onto the base member 16a. And the base member 16a and the pad 17 is deformed as shown by dotted lines, so that the projection 17a is formed in the bonding face of the pad 17, to which the flying lead 18 will be bonded.

Figure 5A:
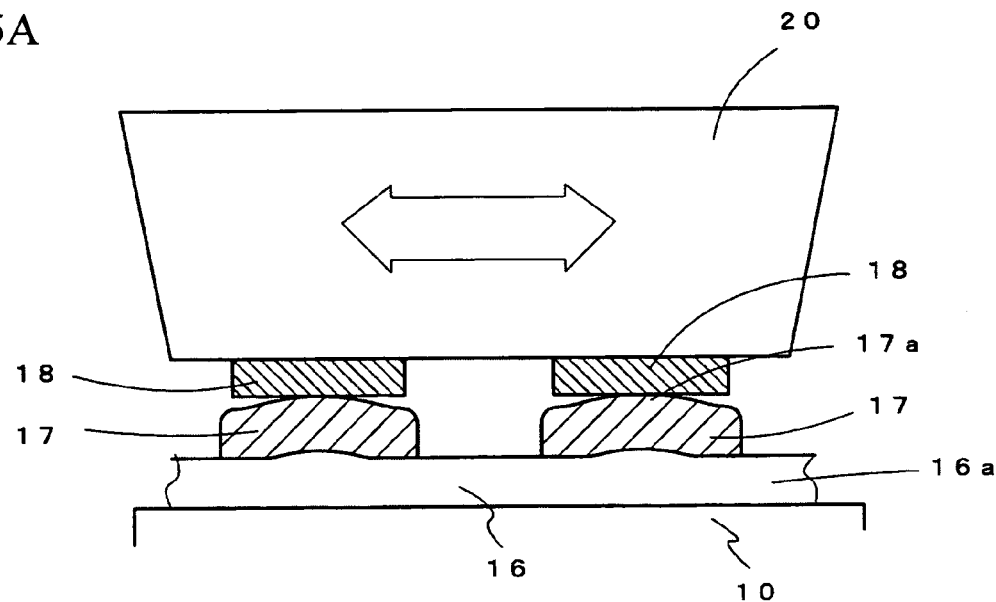
FIGS. 5A and 5B are explanation views showing a process of bonding flying leads to the pads formed by the method of the third embodiment.
Figure 5B:
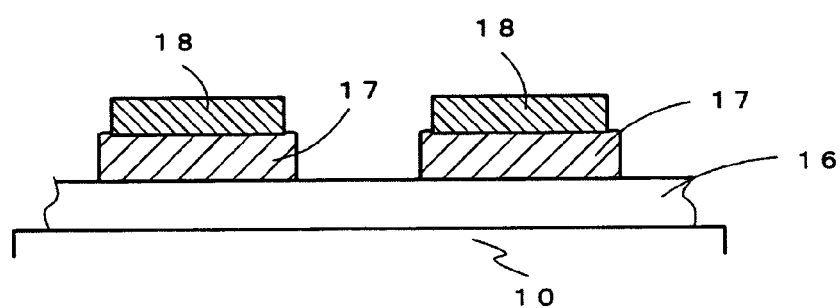

In FIG. 5A, the flying leads 18 are supersonic-bonded to the pads 17, each of which has the projection 17a in the upper face of the bonding face. In each of the pads 17, a center part of the bonding face, which is slightly upwardly expanded, is the projection 17a.

In the present embodiment too, the projections 17a act as the margins for deformation when the flying leads 18 are supersonic-bonded to the pads 17. When the flying leads 18 are supersonic-bonded to the pads 17 by the bonding tool 20, the projections 17a are crushed so that the flying leads 18 can be securely bonded to the pads 17. In FIG. 5B, the flying leads 18 have been securely bonded to the pads 17.

Fourth Embodiment

A fourth embodiment of the present invention will be explained with reference to FIGS. 6 and 7.

In the present embodiment, wedge sections 32a are formed at lower ends of press tools 32. The wedge sections 32a are respectively driven into the pads, and the wedge sections 32a are left in the board 16 so that the projections 17a are formed in the bonding faces of the pads 17, to which the flying leads 18 will be bonded.

Figure 6:
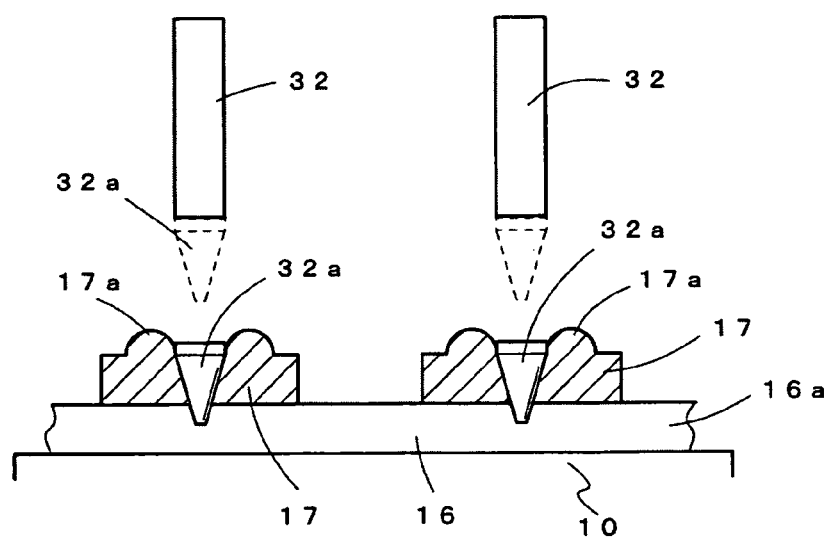
FIG. 6 is an explanation view showing a process of forming projections in pads by the method of a fourth embodiment.

In FIG. 6, the press tools 32 having the wedge sections 32a at the lower ends are moved downward, and the wedge sections 32a are driven into the pads 17. The wedge sections 32a can be easily separated from the press tools 32 by breaking the press tools 32. The press tools 32 are moved downward until lower ends of the wedge sections 32a reach the plastic base member 16a. By driving the wedge sections 32a into the pads 17, the projections 17a rise in the bonding faces of the pads 17, to which the flying leads 18 will be bonded.

Figure 7:
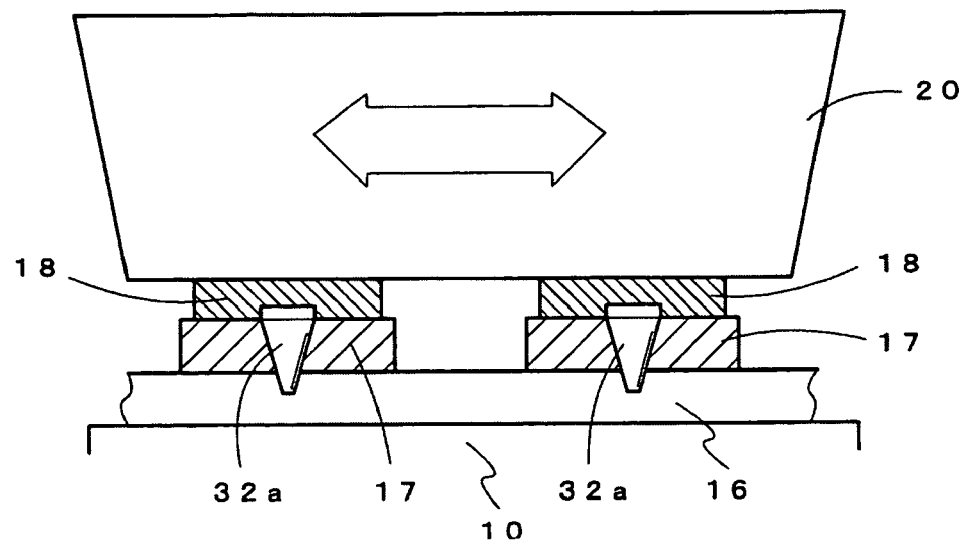
FIG. 7 is an explanation view showing a process of bonding flying leads to the pads formed by the method of the fourth embodiment.
Figure 8:
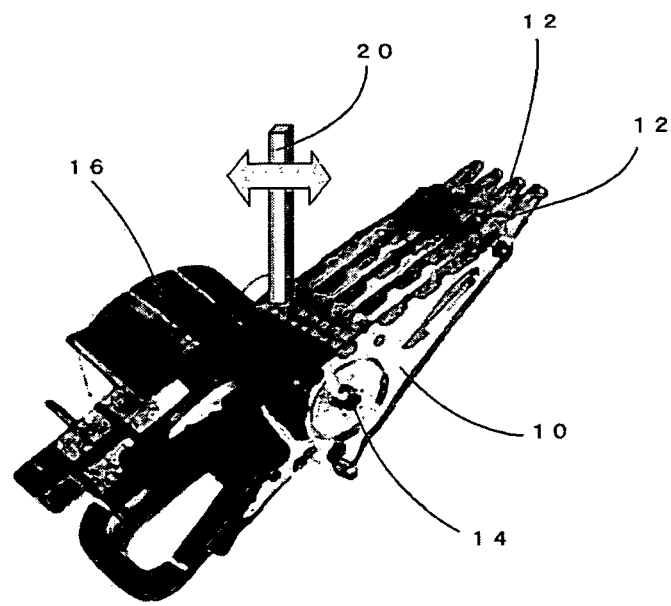
FIG. 8 is a perspective view of the conventional carriage assembly having the long tail suspension board.
Figure 9:
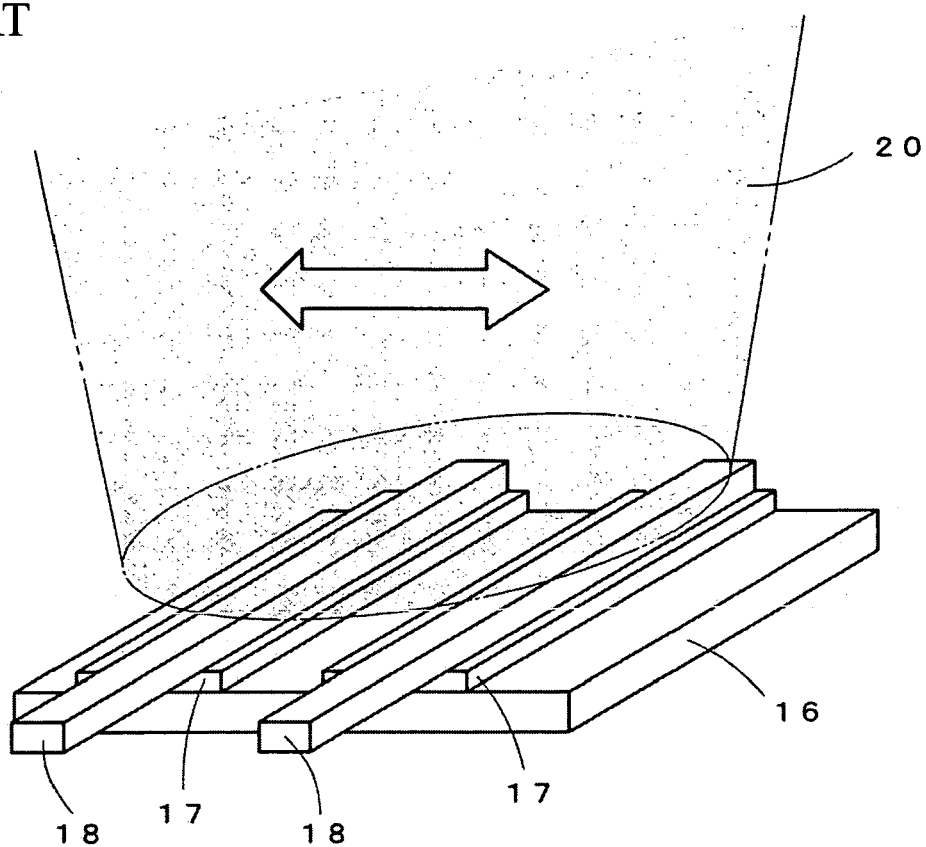
FIG. 9 is an explanation view showing the conventional method of bonding the flying leads to the pads.
Figure 10:
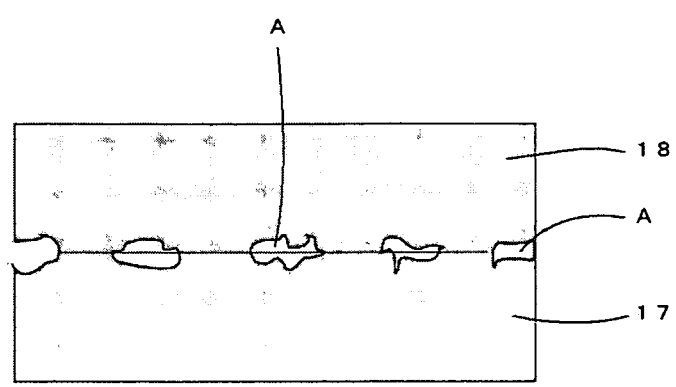
FIG. 10 is a sectional view of the boundary of the flying lead and the pad, which are mutually bonded.

In FIG. 7, the flying leads 18 are bonded to the pads 17 by applying supersonic vibrations to the bonding tool 20. The flying leads 18 are pressed onto the pads 17 with applying supersonic vibrations to the flying leads 18, so that the projections 17a are crushed and the flying leads 18 can be securely bonded to the pads 17. In case that upper ends of the wedge sections 32a are slightly projected upward from the upper faces of the pads 17, the projected parts of the wedge sections 32a are bonded to the flying leads 18 together with the pads 17.

In the present embodiment, the wedge sections 32a form the projections 17a, which act as the deformation margins when the supersonic bonding is performed, and increase bonding strength between the flying leads 18 and the pads 17. The bonding strength of the present embodiment using the wedge sections 32a is greater than that of the former embodiments, in each of which the flying leads 18 are bonded to the pads 17 only. Note that, in the present embodiment, the wedge sections 32a are left in bonded parts between the flying leads 18 and the flexible board 16, so surfaces of the wedge sections 32a may be plated with a corrosion-resisting metal, e.g., gold.

The invention may be embodied in other specific forms without departing from the spirit of essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of bonding flat-shaped flying leads to pads of a board, comprising the steps of:
    mechanically processing the board so as to form projections, which act as margins for deformation, in bonding faces of the pads, on each of which a flying lead will be bonded,
    positioning the flying leads to correspond to the pads; and
    applying supersonic vibrations to a bonding tool, the bonding tool having a width that is larger than an interval between the projections, so as to deform and crush the projections, whereby the flying leads are respectively bonded to the pads;
    wherein each of the projections is formed by pressing a press tool onto the pads of a board so as to form a cavity in the bonding face, so that the projection is formed along an edge of the cavity.

2. The method according to claim 1,
    wherein the mechanical processing step is performed by:
    driving a wedge section formed at a front end of a press tool into each of the bonding faces so as to form the projection around the wedge section; and separating the wedge section from the press tool so as to leave the wedge section in the pad.

3. The method according to claim 1,
    wherein the press too) doubles as the bonding tool,
    the flying leads are positioned to correspond to the pads after forming the cavities in the pads by the press tool, and
    supersonic vibrations are applied to the press tool so as to bond the flying leads to the pads.

4. The method according to claim 3, wherein the press tool serves as the bonding tool.

5. The method according to claim 1, wherein the margins for deformation are margins later to be deformed.

6. The method according to claim 1, wherein the pads are metallic, the pads and flying leads are gold-plated, and comprising electrically connecting the pads and the flying leads by gold-gold bonding.

7. The method according to claim 1, wherein the flying leads in cross section comprise a rectangle having a width greater than a thickness thereof.

8. A method of bonding flat-shaped flying leads to pads of a board, comprising the steps of:
    mechanically processing the board so as to form projections, which act as margins for deformation, in bonding faces of the pads, on each of which a flying lead will be bonded,
    positioning the flying leads to correspond to the pads; and
    applying supersonic vibrations to a bonding tool, the bonding tool having a width that is larger than an interval between the projections, so as to deform and crush the projections, whereby the flying leads are respectively bonded to the pads;
    wherein each of the projections is formed by pressing a press tool onto a reverse face of the board toward the pad, so that the projection is formed in the bonding face.

9. The method according to claim 8, wherein the flying leads in cross section comprise a rectangle having a width greater than a thickness thereof.

* * * * *